US007826561B2

(12) United States Patent
Gibbs

(10) Patent No.: US 7,826,561 B2
(45) Date of Patent: Nov. 2, 2010

(54) SINGLE SIDEBAND VOICE SIGNAL TUNING METHOD

(75) Inventor: John A. Gibbs, Edmonds, WA (US)

(73) Assignee: ICOM America, Incorporated, Bellevue, WA (US)

( * ) Notice: Subject to any disclaimer, the term of this patent is extended or adjusted under 35 U.S.C. 154(b) by 831 days.

(21) Appl. No.: 11/642,156

(22) Filed: Dec. 20, 2006

(65) Prior Publication Data

US 2008/0153441 A1 Jun. 26, 2008

(51) Int. Cl.

| | |
|---|---|
| ***H03C 1/52*** | (2006.01) |
| ***H04L 27/04*** | (2006.01) |
| *H04L 27/00* | (2006.01) |
| *H04L 27/06* | (2006.01) |
| *H03D 1/00* | (2006.01) |

(52) U.S. Cl. ....................... 375/301; 370/503; 375/326; 375/343; 455/184.1

(58) Field of Classification Search ................. 370/503; 375/301, 326, 343; 455/184.1
See application file for complete search history.

(56) References Cited

U.S. PATENT DOCUMENTS 3,969,675 A 7/1976 Gosling
3,995,115 A * 11/1976 Kelly .......................... 380/32
4,206,410 A 6/1980 Ito et al.
4,539,707 A 9/1985 Jacobs et al.
4,625,331 A 11/1986 Richardson et al.
5,249,202 A 9/1993 Hillum et al.
5,265,121 A * 11/1993 Stewart ....................... 375/346
5,418,778 A * 5/1995 Cummiskey et al. ........ 370/291
5,565,764 A * 10/1996 Priebe et al. ............. 324/76.21
5,969,282 A * 10/1999 Berners et al. ................ 84/603
6,419,638 B1 * 7/2002 Hay et al. ................... 600/558
6,470,311 B1 * 10/2002 Moncur ...................... 704/208
6,480,236 B1 * 11/2002 Limberg ..................... 348/555
6,665,332 B1 * 12/2003 Carlson et al. .............. 375/130
6,694,075 B1 * 2/2004 Bhatia et al. .................. 385/37
6,850,252 B1 * 2/2005 Hoffberg .................... 715/716

(Continued)

FOREIGN PATENT DOCUMENTS

JP 61-292411 A 12/1986

(Continued)

OTHER PUBLICATIONS

Dick, Dr. Robert J., "Co-Channel Interference Separation," Pattern Analysis and Recognition Corp., RADC-TR-80-365, Final Technical Report, Dec. 1980. Rome Air Development Center Air Force Systems Command, Griffiss Air Force Base, New York 13441.

(Continued)

*Primary Examiner*—David C Payne
*Assistant Examiner*—Erin M File
(74) *Attorney, Agent, or Firm*—Frishauf, Holtz, Goodman & Chick, P.C.

(57) ABSTRACT

Method for tuning a Single Sideband receiver including processing the signal in the time domain, converting the signal to the frequency domain, processing the signal in the frequency domain, converting the modified signal from the frequency domain to a correlation domain, processing the signal in the correlation domain and analyzing the processed signal from the correlation domain to determine a receiver tuning error.

29 Claims, 6 Drawing Sheets

U.S. PATENT DOCUMENTS

| | | | | |
|---|---|---|---|---|
| 7,062,434 | B2 * | 6/2006 | Zinser et al. | 704/233 |
| 2004/0267143 | A1 * | 12/2004 | Sweeney | 600/509 |
| 2005/0102137 | A1 * | 5/2005 | Zinser et al. | 704/229 |
| 2005/0107699 | A1 * | 5/2005 | Loftman et al. | 600/437 |
| 2007/0053513 | A1 * | 3/2007 | Hoffberg | 380/201 |
| 2007/0217551 | A1 * | 9/2007 | Kang et al. | 375/343 |
| 2008/0112479 | A1 * | 5/2008 | Garmany et al. | 375/231 |

FOREIGN PATENT DOCUMENTS

| | | | | |
|---|---|---|---|---|
| JP | 09-036705 | A | | 2/1997 |
| JP | 09-261112 | A | | 10/1997 |
| JP | 2000-209117 | A | | 7/2000 |
| WO | WO 2004008339 | A1 | * | 1/2004 |

OTHER PUBLICATIONS

Dick, Robert, "Tune SSB Automatically," QEX, Jan./Feb. 1999, pp. 9-18. 13 Speer St., Somerville, NJ 08876.

Geissinger, Gary. A., "A Blind Automatic Frequency Control Algorithm for Single Sideband," QEX, Jul./Aug. 2005, pp. 38-44. Digital Globe Inc. 1601 Dry Creek Dr., Suite 260, Longmonth, CO 80501.

Rhode, Ulrich L., et al., "Communications Receivers: Principles and Design," Other Receiver Circuits, Second Edition, McGraw-Hill, pp. 552-558, Jan. 15, 1997.

Rabiner, Lawrence R., et al., "Digital Processing of Speech Signals," Prentice-Hall, Inc., Englewoods Cliffs, New Jersey 07632, pp. 150-158, Sep. 15, 1978.

* cited by examiner

SINGLE SIDEBAND VOICE SIGNAL TUNING METHOD

FIELD OF THE INVENTION

The present invention relates generally to methods for automatically tuning single sideband voice signals.

BACKGROUND OF THE INVENTION

Single Sideband modulation (SSB) is very efficient in the use of the frequency spectrum. Other common modulations, such as amplitude modulation (AM) and frequency modulation (FM), are very inefficient. AM takes twice as much spectrum and FM can take 4 to 8 times the spectrum. Since frequency spectrum is a scarce resource, any technology that can conserve frequency spectrum is of high value.

SSB is also very power-efficient. Compared to AM, SSB communications can be made with less than one tenth the power. Reducing the transmitted power reduces the interference to other communication services and thereby also improves the frequency spectrum usage.

However, SSB signals need to be tuned within approximately 10 Hertz (Hz) to avoid significant audio distortion. Signals mistuned much beyond this limit sound either like a deep rumble or like Donald Duck, depending on the direction of mistuning.

One solution has been to transmit only on certain specific frequencies (channels). However, this requires that both the high-frequency transmitter and receiver be tuned to exactly the correct frequency. This may require tuning to within about 20 parts per billion, depending on the carrier frequency. This degree of accuracy is expensive to implement, particularly over a wide range of environmental conditions and must be maintained over the expected lifetime of the radio. This is the reason that Marine HF SSB radios have a "clarifier" control for operator adjustment of the receiver frequency. This adjustment is somewhat difficult to use and requires practice to adjust for adequate audio quality. A second disadvantage of channelized operation is reduced spectral efficiency. It is often advantageous to slightly change frequency to avoid RF interference instead of abandoning the channel altogether and shifting to another channel.

A second solution, well-known to those skilled in the art, is to add a known frequency audio tone (pilot tone) to the transmitted signal. If the receiving station knows the transmitted pilot tone frequency, it can automatically adjust the received frequency to set the received pilot tone to the desired frequency. There are at least three disadvantages to this solution. First, the transmitter and receiver must be designed to work with the same pilot tone frequency and amplitude. This discourages the formation of ad hoc communications and is incompatible with existing radio infrastructure. Considering the large number of SSB transceivers in use today, updating this equipment is impractical and inventions using pilot tones are of limited utility. Second, the added pilot tone needlessly consumes transmitter power. Maximum transmitted power is usually limited by regulation; so wasted power reduces range and the readability of the signal. Finally, receiver bandwidth is limited to minimize noise, and interference. Therefore, if the receiver is mistuned by more than a few hundred Hz, the pilot tone can be filtered off and the automatic tuning will fail.

Several tuning techniques attempt to use the properties of voice signals to automatically tune SSB voice signals (see, for example, "Co-Channel Interference Separation" by Robert Dick, December 1980, "Tune SSB Automatically" by Robert Dick, QEX magazine, January/February 1999, "A Blind Automatic Frequency Control Algorithm for Single Sideband" by Gary Geissinger, QEX magazine July/August 2005, and "Communications Receivers" by Dr. Ulrich Rohde. None of these techniques have successfully and consistently tuned actual voice SSB signals.

In contrast with the above prior art, the invention requires no modifications to the transmitter and so a receiver equipped with this invention can be used with any SSB transmitter in use today. It can also correct for much larger tuning errors. As discussed in detail below, this invention analyzes the properties of the transmitted human voice, independent of language and retunes the receiver to the actual transmitted signal frequency with a high degree of accuracy. This can be done faster than a trained operator can retune the radio.

OBJECTS AND SUMMARY OF THE INVENTION

It is an object of the present invention to provide new methods and systems for automatically tuning single sideband voice signals that do not require specially modified transmitters. This invention has the additional advantage that it can be either implemented internally in new receivers or implemented with external hardware and/or Personal Computers (or other computing device) and an existing SSB receiver.

In order to achieve this object and others, a method for tuning a receiver comprises receiving a voice signal, optionally filtering the signal, processing the signal in the time domain, converting the signal to the frequency domain, processing the signal in the frequency domain, converting the modified signal from the frequency domain to a correlation domain, processing the signal in the correlation domain and analyzing the processed signal from the correlation domain to determine the receiver tuning error.

The receiver tuning error can be used for any purpose known to those skilled in the art. For example, the radio operator could be notified of the receiver tuning error to enable retuning of the radio. An automatic retuning of the radio could also be performed using the receiver tuning error obtained using the invention. Also, the Receiver Increment Tuning (RIT) function found on many radios could be used applying the receiver tuning estimate, which function does not change the frequency setting displayed on the radio but does change the tuning. An advantage of this is that if the RIT is cleared, then the radio is back to the original frequency.

In accordance with one embodiment of the invention, processing of the signal in the time domain may entail removing the effects of the speaker's vocal tract by center clipping the signal. In the time domain, this may involve determining a level at which to center clip the signal based on a root mean squared (RMS) or mean absolute deviation (MAD) criteria. The center clipped signal is then windowed, using a triangular window, for example, and zero padding the signal. In the frequency-domain, phase information is removed. In addition, undesired frequencies may be removed (including negative frequencies) and frequency components whose magnitude is less than a predetermined percentage of the largest frequency component.

The pitch and frequency offset of the voice sample can be estimated in the correlation domain. This preferably involves correcting for the undesired effects of time domain windowing. To estimate the pitch and offset frequency, the signal in the correlation domain is preferably curve-fit using a regression of at least 5 points. Then, the location of the peak magnitude of the signal is determined by interpolation and the offset frequency and pitch are calculated based thereon.

Analysis of the processed signal may involve determining whether the peak magnitude is above a threshold indicative of a voiced sound and if not, the processed signal is disregarded. This eliminates the effects in the tuning method of unvoiced sounds and pauses in the voice, which often causes errors in prior art methods.

Analysis of the processed signal may further involve comparing the peak magnitudes at one-half and/or two times the estimated pitch frequency to determine if pitch doubling or halving has occurred, which often causes errors in prior art methods.

If all the frequency components of the voice pitch were present in this frequency domain data, it would be trivial to determine the receiver tuning error of a closely tuned signal. However, typical SSB transmitters filter off frequency components below about 300 Hz. The majority of adult voices have a pitch from about 50 Hz to about to 250 Hz, so the fundamental pitch and several harmonics can be filtered off before transmission. Therefore, with a single measurement, it is only possible to know the receiver tuning error to within a multiple of the pitch. This problem is further aggravated when the receiver is significantly mistuned as the receiver filters can remove additional pitch harmonics from the transmitted signal. For these reasons, it is necessary to do further processing of the signal after extracting the pitch and frequency offset for a short voice segment.

The natural variation in voice pitch over time makes it possible to determine the actual receiver tuning error from multiple estimates of pitch and frequency offset. In one particularly advantageous embodiment of the invention, a cost function is formed from multiple estimates of the receiver tuning error and used to determine the actual receiver tuning error. In the cost function, voiced sounds far from a trial estimated receiver tuning error contribute a larger error to the cost function.

Another particularly advantageous embodiment of the invention uses a statistical test to determine if enough samples of the voice have been taken to determine the receiver tuning error accurately. Specifically, it is determined whether a statistically significant difference is present between the best estimate of the receiver tuning error from the cost function and a second best estimate. If so, the first estimate is considered as the actual receiver tuning error. Otherwise, another segment of the received voice signal is processed.

An advantage of using a statistical test is that it is not known a priori how many speech segments must be processed. Natural speech has pauses and fricative (unvoiced) sounds that do not contribute to an estimate of the receiver tuning error. As such, the time required for acquiring sufficient voiced speech segments is unknown. The alternative used in the prior art is to process an excessive length of speech. This long processing time improves the likelihood (but does not guarantee) that enough voiced sounds will have been processed, but at the cost of greatly increased tuning time.

BRIEF DESCRIPTION OF THE DRAWINGS

The invention, together with further objects and advantages hereof, may best be understood by reference to the following description taken in conjunction with the accompanying drawings, wherein like reference numerals identify like elements and wherein.

DETAILED DESCRIPTION OF THE INVENTION

Figure 1:
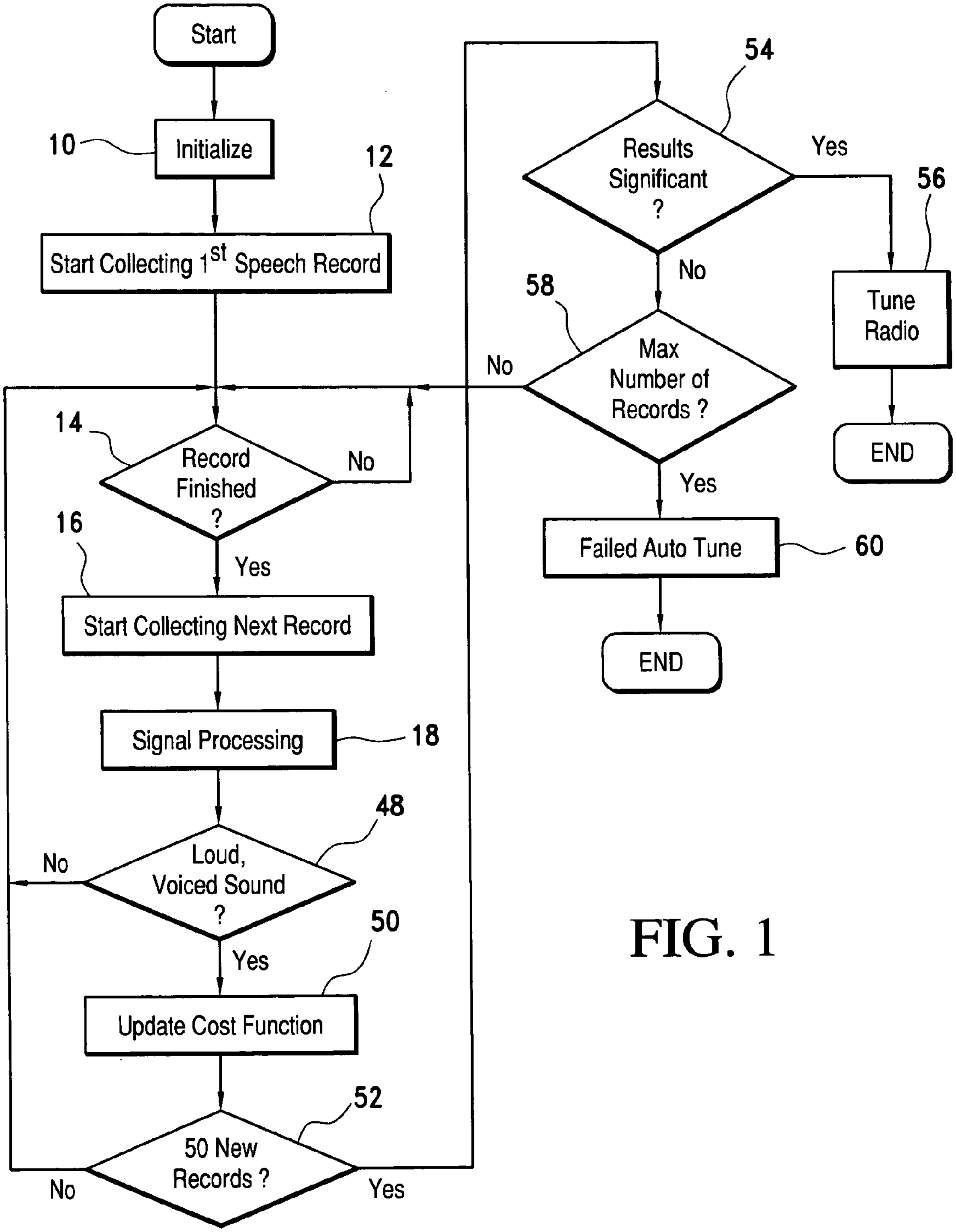
FIG. 1 is a flow chart of the operation of a method for tuning a receiver in accordance with the invention.

Referring to the accompanying drawings wherein like reference numerals refer to the same or similar elements, a flow chart of a general embodiment of a method for tuning a receiver or radio in accordance with the invention is shown in FIG. 1. At the beginning of the method, in step 10, the system is initialized to tune the receiver or radio and a first speech record is collected (step 12). A determination is made as to whether the speech record is finished, i.e., complete (step 14). As soon as the speech record is finished, collection of a subsequent speech record is immediately started (step 16) and signal processing begins on the finished speech record (step 18).

A preferred embodiment of use of this invention is within a SSB radio. However, it is to be understood that other implementations including Personal Computers, PDA's and custom external hardware fall within the scope of this invention.

It is further understood that the scope of this invention includes operation with traditional analog-based radios, analog radios with audio Digital Signal Processing (DSP) and radios with RF and/or IF DSP processing.

It will be obvious to those skilled the art that this invention can be implemented on demodulated voice signals in either digital or analog form. Also included within the scope of this invention is the processing of the voice signals before the SSB demodulator, at what is commonly called the Intermediate Frequency in either analog or digital form.

In a preferred embodiment, the demodulated voiced signal is input to the invention in either analog or digital form. If radio is implemented with DSP, then the ADC and filtering step described below are usually unnecessary.

It is understood by those skilled in the art of digital signal processing that the voice signal must by sampled at greater than the Nyquist frequency. Since SSB receivers commonly filter voice signals to a 3 kHz maximum frequency, this means that the sampling frequency must be greater than 6 kHz. It is advantageous to increase the sampling frequency further as it improves the resolution in the correlation domain and therefore improves the estimates of pitch and frequency offset. The correlation domain is also sometimes referred to as the convolution domain. A preferred embodiment uses at least 11 kHz, but other sample rates are covered under the scope of this invention.

Figure 2:
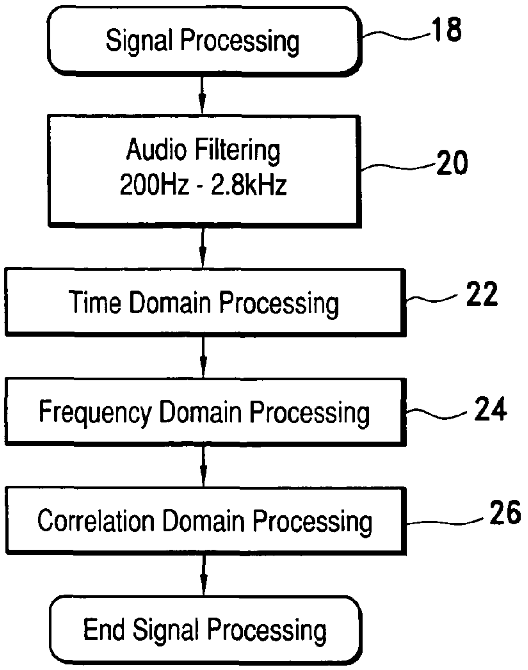
FIG. 2 is a flow chart of the signal processing block in FIG. 1.
Figure 11A:
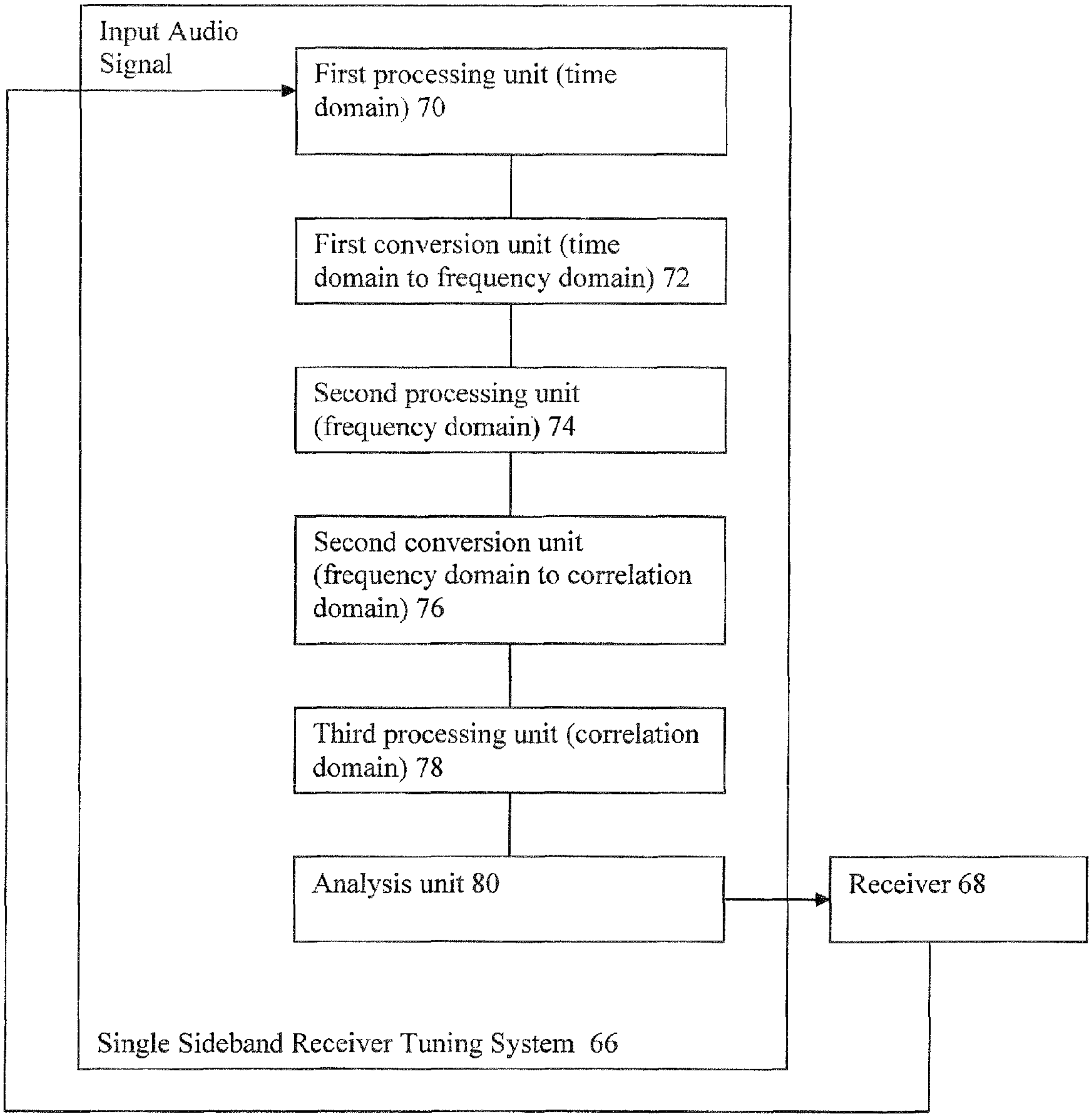
FIG. 11A is a schematic showing a system for tuning a single sideband receiver, that is external to the receiver, to receive signals at a desired frequency that performs the method for tuning a receiver shown in FIG. 1.
Figure 11B:
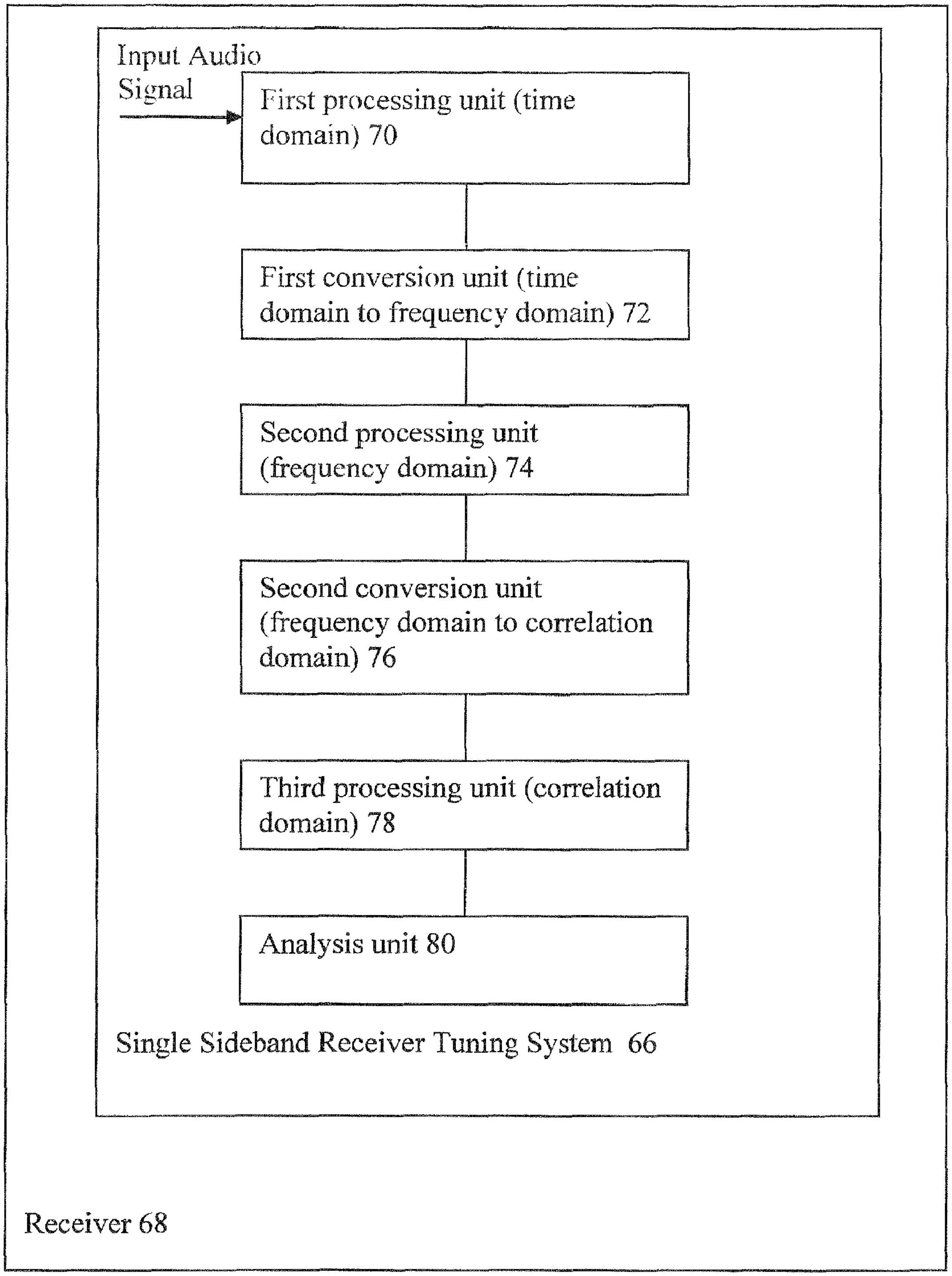
FIG. 11B is a schematic showing a system for tuning a single sideband receiver, that is incorporated into the receiver, to receive signals at a desired frequency that performs the method for tuning a receiver shown in FIG. 1.

Continuous speech collection and processing is provided wherein while one speech record is being processed, a subsequent speech record is being collected. That is, the signal processing on a speech record does not have to be completed in order to obtain another speech record so that no part of the voice input is missed during the signal processing. The signal processing of the speech record is shown schematically in FIG. 2 and (optionally) involves initial audio filtering (step 20), and then time domain processing (step 22), frequency domain processing (step 24) and correlation domain processing (step 26). A system 66 for tuning a single sideband receiver 68 to receive audio signals at a desired frequency is shown schematically in FIGS. 11A and 11B and includes a first processing unit 70 that performs the time domain processing on the received audio signals, a second processing unit 74 that performs the frequency domain processing (after conversion of the audio signal from the time domain to the frequency domain by a first conversion unit 72), and a third processing unit 78 that performs the correlation domain processing (after conversion of the output of the second processing unit 74 from the frequency domain to the correlation domain by a second conversion unit 76).

The audio filtering (step 20) is designed to eliminate any DC component and high frequency noise from the digitized signal while passing the desired audio or SSB signal. This step can be deleted if the receiver design otherwise eliminates these undesired components.

Figure 3:
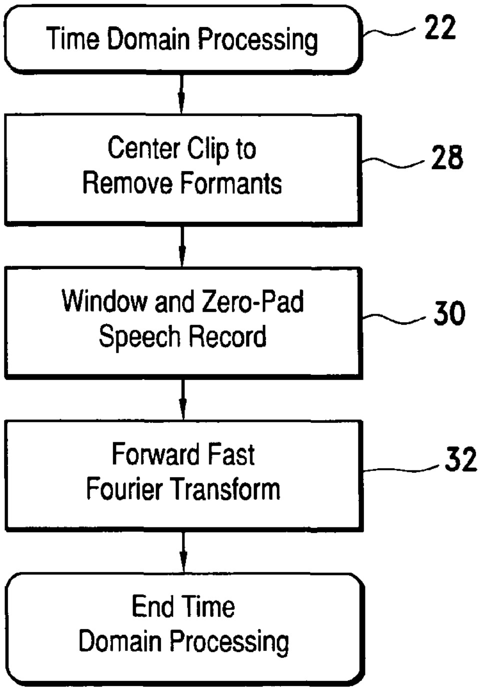
FIG. 3 is a flow chart of the time domain processing block in FIG. 2.

Time domain processing (step 22) is shown schematically in FIG. 3 and involves what is known to those skilled in the art of speech processing as "spectral flattening" to remove the effects of the speaker's voice tract (formants.) Any of the techniques for spectral flattening known to those skilled in the art of speech processing can be used in this invention. In a preferred embodiment, center clipping (step 28) is used to remove the effects of the vocal tract from speech. However, the use of spectral flattening in a method for automatically tuning a radio is believed to be novel.

Figure 6:
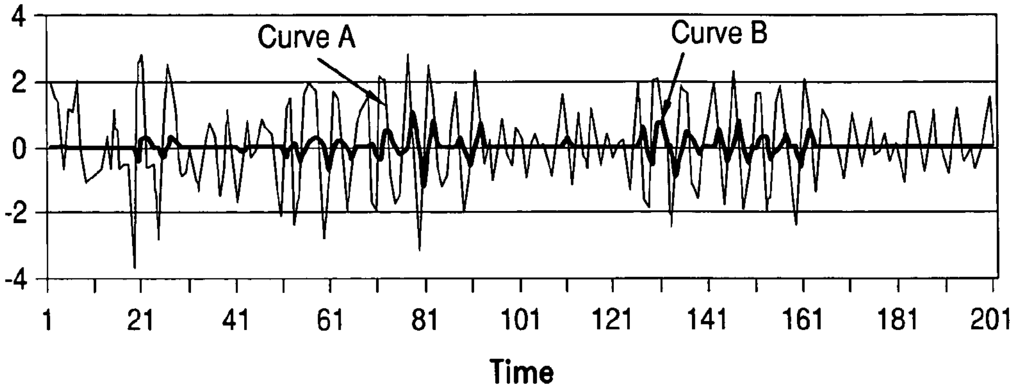
FIG. 6 is a graph showing the effect of time domain center clipping.

FIG. 6 shows a graph of the manner in which center clipping operates in the time domain. The original voice in the speech record is represented by curve A and the voice after being center-clipped is represented by curve B.

Time domain center clipping is shown in FIG. 6 and may be defined as follows:

$$Y(t)=0 \text{ for } |x(t)|<=\text{clip}$$

$$Y(t)=x(t)-\text{clip for } x(t)>\text{clip}$$

$$Y(t)=x(t)+\text{clip for } x(t)<-\text{clip}$$

Various methods for setting the clip level as a percentage of the peak amplitude have been used in speech processing. However, using a clipping level based on the peak amplitude emphasizes noise spikes common on high-frequency SSB signals. In investigations for this invention, it was found that two other criteria better fit the signal characteristics, RMS (root mean squared) and MAD (mean absolute deviation). Since noise spikes have high amplitude but low energy, the RMS criteria tends to minimize the contribution of noise spikes to the threshold level. In a preferred embodiment, it has been determined that 30% of the RMS level is the best clipping level. Nevertheless, other percentages of the RMS or MAD level may also be used in the invention.

Windowing (step 30) is used to produce the best results in the frequency domain. While windowing is generally known to those skilled in the art of signal processing, its application of receiver tuning is different. In stationary signal analysis, the window length is selected based on the required frequency domain resolution. When tuning a receiver, the frequency domain resolution is not a concern and short windows should be used to approximate stationary conditions required for pitch estimation in spite of the non-stationary characteristics of a voice signal. However, longer windows are desirable to more accurately estimate the pitch, particularly for low-pitched male speakers. In a preferred embodiment, a 40 msec window is used. Other window lengths can be used in this invention.

Second, the shape of the window function can be selected to ensure that the frequency transform of the window is non-negative at all frequencies to enable window corrections to be performed in the correlation domain. Without such corrections in prior art tuning methods, such as the Dick method, it is likely that the pitch frequency estimate will be too high because the undesired effects of the window function in the correlation domain attenuated the peak at the actual pitch.

An example of a window that is always positive in the frequency domain and whose correlation domain effects are easy to correct is the triangle window. Its frequency transform has a $\sin^2 f/f^2$ shape. Although such a triangular window is a preferred window, other windows can be used in the invention.

With respect to window leakage, it is well known by those skilled in the art that short time windowing creates greater leakage in the frequency domain. Such leakage will cause errors in the estimate of the frequency offset. An algorithm in accordance with the invention assumes that at the peak of the correlation magnitude function, the phase is only determined by the frequency tuning error. However, this algorithm is correct only if there is no energy at any frequencies besides the offset pitch frequencies.

In an alternative embodiment, multiple width windows are used. The pitch is first estimated with the window discussed above. If the pitch is found to be too low for accurate estimation (less than about 4 cycles in the window), then the processing of the record is restarted with a window of approximately twice the length. If sufficient computing power is available, this technique will converge faster and more reliably to the correct tuning frequency. The use of multiple windows for tuning a receiver is believed to be novel.

A further consideration in windowing the voice signal is whether to overlap the windows. Overlapping of time records before frequency transforms is known by those skilled in the art for noise reduction averaging of steady-state signals. However, its application to receiver tuning is believed to be novel.

For instance, prior art for receiver tuning indicates that it is best that the windows not overlap by more than 50%, so they are not too redundant. Those skilled in the art know this is correct if overlapped processing is used for noise reduction because the estimates are not statistically independent. However, in this invention, overlap processing is used in conjunction with the cost function to self-align the window with short voiced sounds, not noise reduction.

Figure 7:
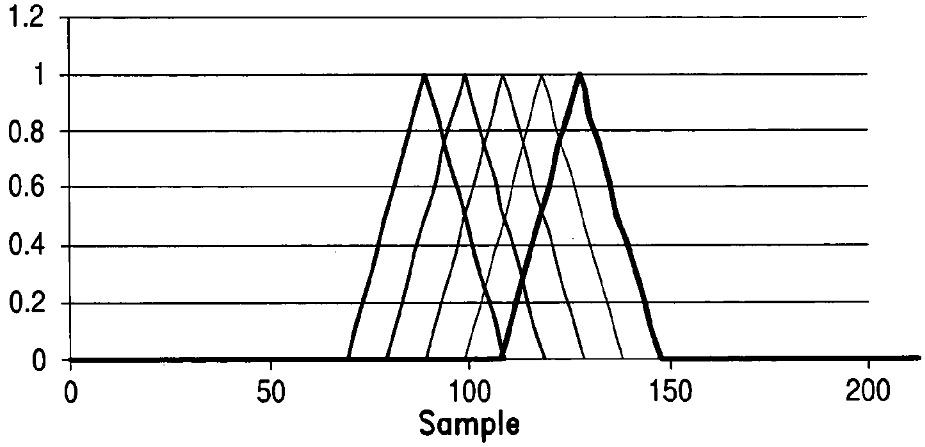
FIG. 7 is a graph showing a 75% overlap triangular window.

When overlap processing was implemented on actual SSB received signals, it was found for a 40 msec triangular window that performance is optimized by using 75% overlap (25% delay) as shown in FIG. 7. It was determined that for voice signals, which by nature are highly variable, the alignment of the window with short voiced sounds is critical in developing a good tuning error estimate.

The final step in the preferred time domain processing is to zero pad the time record (step 30). Zero padding is a technique that is known to those skilled in the art of autocorrelation computation to avoid aliasing in the autocorrelation domain. However, use of zero padding to improve the accuracy of pitch and frequency offset estimation in automatically tuning a SSB radio is believed to be novel.

Forward Fast Fourier Transform (FFT-step 32) is a signal processing technique known to those skilled in the art to convert the time domain signal into the frequency. The FFT is a preferred embodiment for conversion to the frequency domain, but other transforms such as Discrete Fourier, Discrete Cosine, Wigner, Cohen, Gabor and Wavelet transforms are also included in this invention as other transform methods obvious to those skilled in the art.

Figure 4:
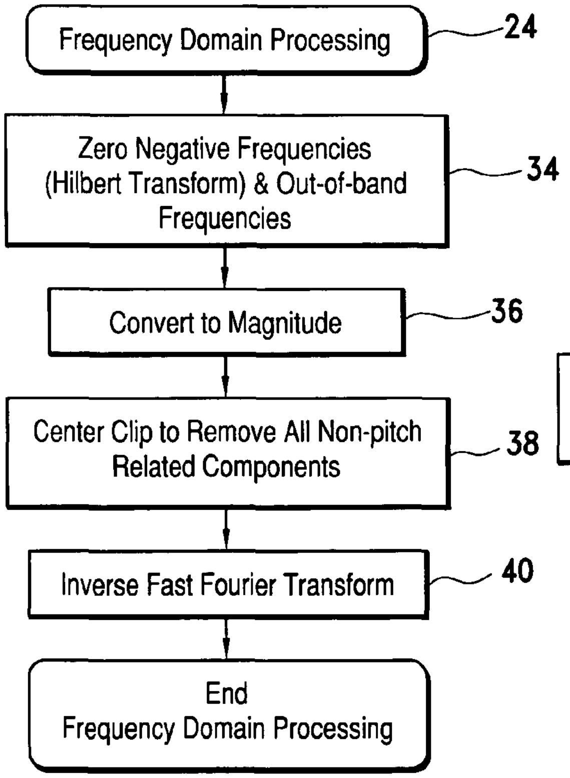
FIG. 4 is a flow chart of the frequency domain processing block in FIG. 2.

Frequency domain processing is shown schematically in FIG. 4 and involves setting the negative frequency components to zero (this is the same as converting to SSB using a Hilbert transform), step 34. Note that this step is unnecessary if the algorithm input was from the IF SSB signal. Additional frequency domain processing steps, of a preferred embodiment, include conversion of the frequency domain results to magnitude only signals (step 36), center clipping to remove all non-pitch related components (step 38) and application of an inverse Fast Fourier Transform (step 40).

Low and high frequency results that are known to be outside of the range of the receiver audio response are also set to zero to minimize errors in subsequent calculations. In particular, powerline hum and high frequency noise is eliminated by this operation.

Conversion of the frequency domain results to magnitude only (removing the phase information) (step 36) eliminates all absolute time information from the results. Therefore, the algorithm does not distinguish between voice records at the beginning and end of a conversation and all voiced sounds are treated equally. Conversion to magnitude only can be done by any of several techniques and approximations known to those skilled in the art.

Figure 8:
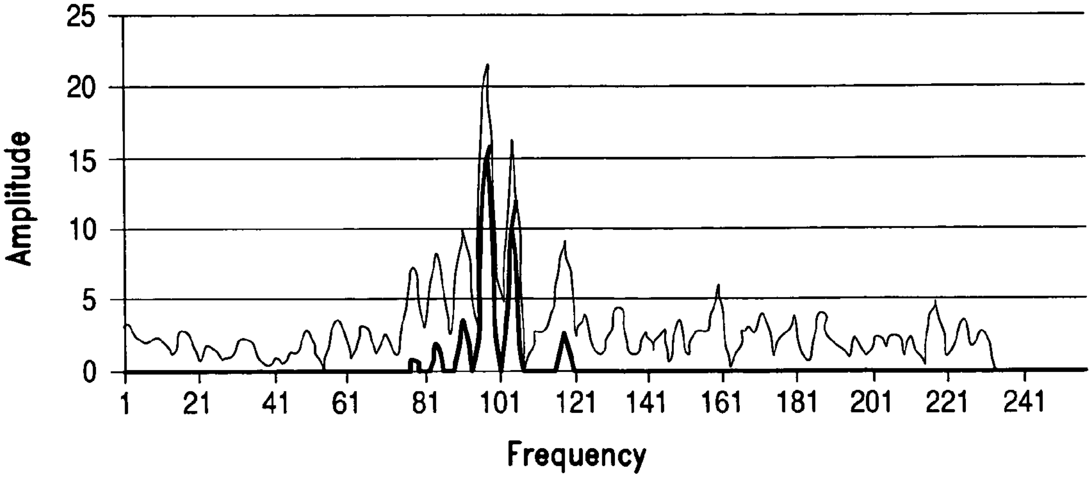
FIG. 8 shows the effect of frequency domain center clipping.

Center clipping in the frequency domain (step 38) involves elimination of all sounds not produced by the vocal cords. This is desirable in order to determine an accurate estimate of the pitch and offset frequency of the voice record. One way to do this is to set all frequency components that are less than a predetermined percentage, e.g., 5%, of the largest component to zero using an appropriate clipping function (which may be defined in a similar manner as the time domain clipping function described above). FIG. 8 shows the effect of frequency domain center clipping.

In a preferred embodiment, the center clipped magnitude data is directly converted to the correlation domain. However, other frequency domain processing can be performed at this point and is included within the scope of this invention.

Specifically, if further signal processing includes the logarithm of the magnitude, this will generate a result in the correlation domain similar to the Cepstrum, which is known to those skilled in the art. The magnitude data can also be raised to an integer or fractional power, which will emphasize or de-emphasize the difference in the magnitudes of the frequency domain peaks.

As a final frequency domain processing enhancement included within the scope of this invention, the frequency spectrum can be zero padded and a larger inverse frequency transform used. This will increase the resolution in the correlation or convolution domain yielding improved pitch and frequency offset estimates without increasing the time domain sampling rate.

Once center clipping and any further signal processing discussed above has been performed in the frequency domain, the processed results are converted back to a time-like domain called the correlation domain by applying an inverse Fast Fourier Transform (step 40). Inverse Fast Fourier Transforms are known to those skilled in the art. As with the frequency domain transform mentioned earlier, the inverse transform can be accomplished by other well known transforms such as Discrete Fourier Transform, Discrete Cosine, Wigner, Cohen, Gabor and Wavelet transforms as are also included in this invention as other transform methods obvious to those skilled in the art.

Figure 5:
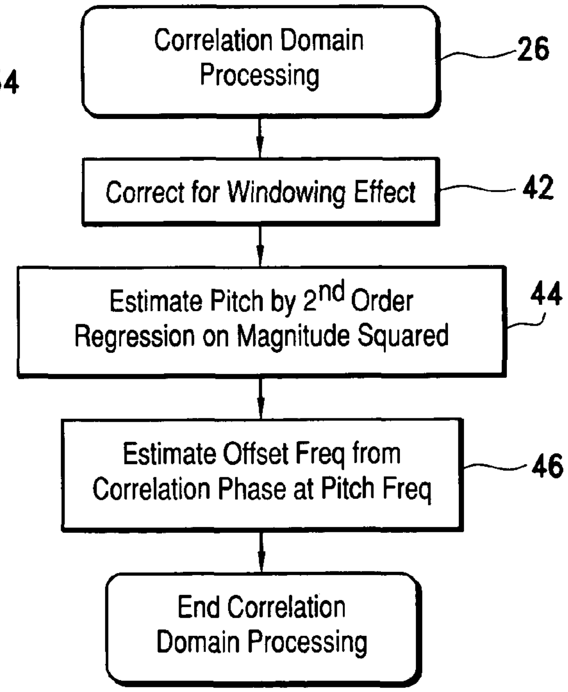
FIG. 5 is a flow chart of the correlation domain processing block in FIG. 2.

A preferred embodiment of correlation domain processing is shown schematically in FIG. 5 and involves correction for windowing effects (step 42), estimating the pitch by a second order regression on the correlation magnitude squared (step 44) and estimation of the offset frequency from the correlation phase at the pitch frequency (step 46).

The first step in the preferred correlation domain processing is to correct for the windowing effect (step 42). Although short time windows are necessary because of the non-stationary pitch of normal voice, it invariably causes problems in the correlation domain. In particular, short time domain windowing greatly reduces the desired peak for low-pitched male speakers in the correlation domain. If not corrected, this often leads to a gross error in the estimation of the pitch and offset frequency. Hence, window correction in the correlation domain is performed. This step is entirely novel and provides substantial advantages over the prior art.

More specifically, the time domain windowing of the voice signal causes the correlation to roll off with increasing $\tau$. There is a desire if not need to remove this window effect before estimating the pitch and frequency offset. However, due to the non-linear operations in the frequency domain, a simple analytical mathematical description of the window effect in the correlation domain cannot be written. Fortunately, it has been discovered that a linear approximation to the measured actual windowing error works well when using test waveforms at a range of pitch from about 50 Hz to about 250 Hz.

In a preferred embodiment, after window correction in the correlation domain, the pitch is roughly estimated, for example, by determining the largest magnitude sample. If this is outside the normal range of voice pitch, the voice record is discarded. The voice is also tested for a phenomenon known to those skilled in the art of speech processing called pitch doubling. The peak is also compared to the correlation magnitude at one half and twice the pitch. If the magnitude of the peak is not 40% greater than these frequencies, the voice record is discarded. (Other percentages can be used within the scope of this invention.) This step is believed to be entirely novel and provides substantial advantages over the prior art for receiver tuning.

If the correlation of the voice record passes these tests, the peak magnitude is more precisely estimated by curve fitting to interpolate the location of the maximum magnitude. The location of the magnitude peak corresponds to the voice pitch period during the windowed voice record. There are many curve fitting routines well known to those skilled in the art and these could be used in this invention. In a preferred embodiment, a second order least squares regression on the correlation magnitude squared is used as it has a low computational load (step 44). It will be recognized by those skilled in the art that the complexity of this interpolation can be reduced or the interpolation completely eliminated by increasing the sampling rate of the received voice signal or zero padding in the frequency domain as discussed above at the cost of increased complexity in the frequency transforms. These variations fall within the scope of this invention.

It has been suggested to use a 3 point fit to a parabola to interpolate between the computed values of the correlation (the Dick method), and this can be used in the invention. However, this is extremely sensitive to noise and other errors.

Thus, in accordance with one embodiment of the invention, instead of using a 3 point curve fit to a parabola, a significant advantage is obtained by using regression fitting to 5 or more points centered around the peak sample of the correlation magnitude squared to improve the accuracy. The regression technique will smooth out any errors in individual points. Smoothing the noise is very important because the phase function is very sensitive to small errors in the estimation of the real and imaginary values at the peak.

To find the pitch period corresponding to the maximum correlation magnitude, the derivative of the above curve fit is computed and set to zero, a well-known technique for finding the maximum.

The last step in the correlation domain processing is to estimate the offset frequency from the phase at the correlation magnitude peak (step 46). Again any of the curve fitting techniques well known to those skilled in the art could be used in this invention. In a preferred embodiment, the phase is estimated by again using a second order, 5 point least squares regression on the real and imaginary parts of the correlation centered around the peak sample of the correlation magnitude squared and computing the phase estimate from the real and imaginary curve fit estimates at the magnitude peak.

From the real and imaginary estimates, the frequency offset is computed using the formula;

$$f_e = f_p \arctan(im/re)/(2\pi)$$

where $f_s$=frequency offset $f_p$=pitch frequency im=imaginary component at peak re=real component at peak In an alternative embodiment, the entire conversion to the correlation domain can be eliminated by curve fitting in the frequency domain. Those skilled in the art will recognize that the second order, 5 point least squares regression curve fit equations can be transformed to the frequency domain. The resulting calculated polynomial coefficients are identical to those calculated in the correlation domain, so the pitch and frequency offset resulting estimates are identical by each embodiment.

This concludes the signal processing (step 18). Referring again to FIGS. 11A and 11B, an analysis unit 80 processes the signal from the third processing unit 78, that performs the correlation domain processing, and determines a receiver tuning error, e.g., as explained below. Once the receiver tuning error is determined, the receiver 68 may be retuned to obtain audio signals at a signal frequency derived from an initial received frequency and adjusted based on the receiver tuning error.

Referring back to FIG. 1, a determination is made as to whether a voiced sound with good signal to noise and interference ratio is present in the speech record (step 48). If not, it is continuously determined whether the next speech record is finished and once finished, the signal processing begins on the next speech record.

If the magnitude of the correlation peak is not sufficiently large, then it is assumed that the speech record does not contain a voiced sound. Therefore, it should not be used to estimate the receiver tuning error. This determination is important because the receiver audio signal can often have long pauses in the speech that add many invalid noisy estimates to the receiver tuning error.

It is important in the invention to determine not only when audio is present, but also if it is voiced or unvoiced sounds. Voiced sounds have the pitch information needed to estimate the mistuning, unvoiced sounds are more like noise and have no useful information for automatic tuning.

In the tuning method of Dick discussed in the papers mentioned above, all time records affect the mistune frequency estimate and the only weighting is the energy in the correlation peak. It was an unstated assumption that unvoiced sounds and noise will have a low correlation and therefore the weighted effect will be small. However, since clearly the majority of the time records could be noise or unvoiced sound, these easily accumulate to a serious error source in estimating the mistuning error.

It was found that an important factor to determine if a voiced signal was present in the record was to measure the ratio of the correlation peak magnitude squared to the sum of all the correlation squared magnitudes. In one practical embodiment, if this ratio is less than about 0.3%, then the measurement is rejected. This number depends on the sample rate. The ratio of 0.3% was selected based on empirical measurements at 11 kHz sample rate.

When a voiced sound is present in the speech record with good signal to noise ratio, within the valid pitch range and the radio has not been retuned during the speech record, the cost function is updated (step 50). This step is entirely novel and provides substantial advantages over the prior art. The cost function provides significantly more accurate receiver tuning error estimates than histogram techniques used in the prior art.

The histogram technique used in prior art, often returns a receiver tuning error estimate off by a multiple of the average pitch. For example, the receiver tuning error estimate can be off by 100 Hz to 200 Hz, whereas by contrast, in the invention, the cost function is accurate to within 5 Hz. A 5 Hz error is not audible, whereas 100-200 Hz is very objectionable.

The cost function is constructed such that voiced sounds that are far from estimated receiver tuning error contribute a large error to the cost function. Therefore, the frequency that has the lowest cost function value is considered to be the receiver tuning error.

The cost function is also designed to allow a simple test to determine if enough voice records have been processed for an accurate receiver tuning error estimate (step 54).

Mathematically, the cost function is preferably a least squares estimate of the receiver tuning error. It is defined as:

$$J(f) = \Sigma w_i * [\text{Int}(n_i p_i + e_i - f)]^2$$

where:

f possible receiver tuning frequency error $w_i$ correlation peak power cubed of the ith record Int Nearest integer (rounding, not truncating)

Figure 10:
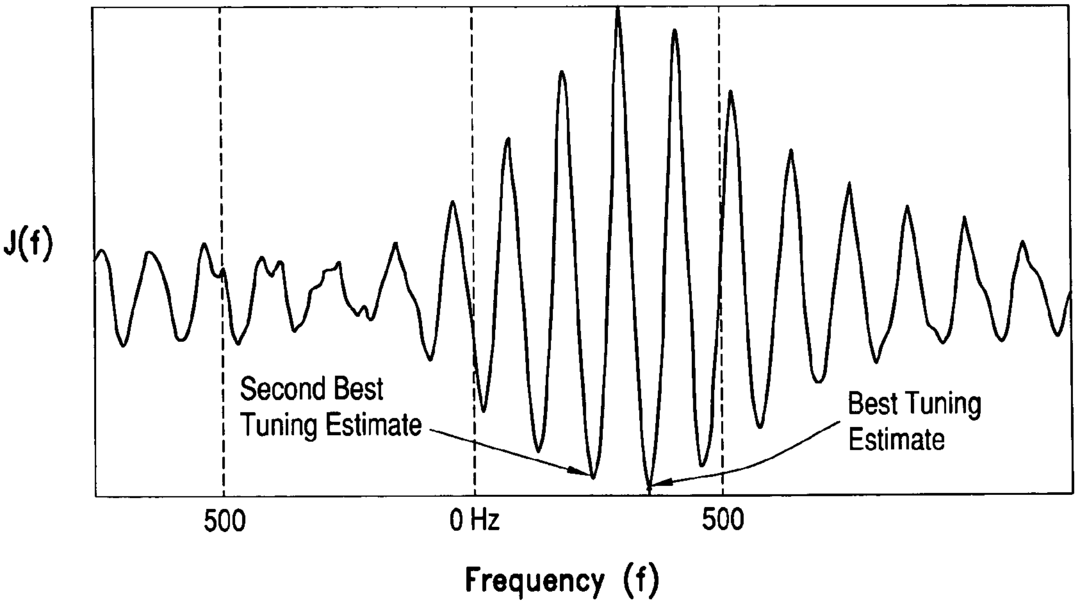
FIG. 10 is a chart of the cost function showing tuning estimates.

$n_i$ Int((f−$e_i$)/$p_i$), pitch multiple of tuning error $p_i$ estimated pitch of $i^{th}$ measurement $e_i$ estimated offset frequency of the $i^{th}$ measurement i Measurement index This function is used to generate an array J(f) for integer f from −900 to +1100 (as shown in FIG. 10). The best estimate of the receiver tuning error is the f with the global minimum value of J.

Other weighting functions and cost functions fall within the scope of this invention. It should also be noted that f can be scaled to any desired frequency resolution.

One of the virtues of the formation and consideration of the cost function is that it forms an excellent basis for determining when to end the algorithm as discussed below.

To determine how many voice measurements are required in the SSB automatic tuning program, the ratio of the cost function of the second best estimate (next best minimum) is divided by the global minimum (best estimate.) This ratio must be greater than the F-Test value if the receiver tuning error estimate is to be considered significantly better than any other frequency.

The F Test is a standard statistical test well known to those skilled in the art of statistics. Any other of statistical test used to determine a significant difference between hypotheses can be used in this invention. However, the use of statistical tests in a method for automatically tuning a radio is believed to be novel.

If the difference is not statically significant to the desired confidence level, the processing should be continued up to the maximum number of records. That is, if the criterion for ending the test is not met, it is easy to continue the test by adding new measurements to the existing cost function without re-computing the previous results.

Figure 9:
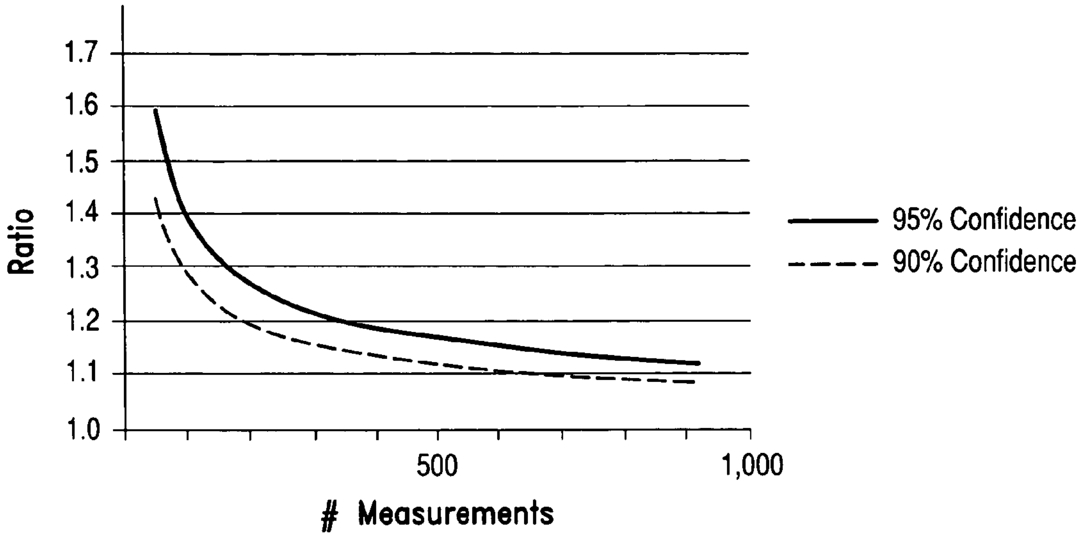
FIG. 9 is a chart of an F-test distribution used in the tuning method in accordance with the invention.

FIG. 9 shows a graph of the required ratio plotted against the number of tests for two different confidence levels. The value of F depends on the number of measurements used in establishing the tuning estimates and on the desired degree of confidence. If the ratio of the two cost function values is greater than F, then we can conclude that there is a significant difference between the tuning estimates.

In a preferred embodiment, the value of F for a given confidence level and number of samples is found in a lookup table. It is within the scope of this invention that the F value could also be interpolated from a smaller table or computed by a formula such as the following approximation when the number of measurements is large.

$$F \sim n/(n-2)\{(4n-4)/(n-4)/n\}^{1/2}y+n/(n-2)$$

where $$y \sim t-(2.30753+0.27061t)/(1+0.99229t+0.04481t^2)$$

and $$t=\{-2\ln(1-P)\}^{1/2}$$

As stated above, if the ratio does not exceed the F-Test value, the program continues to analyze voice time records. Since the algorithm depends on the natural variation of the voice pitch, it is highly unlikely to converge to a good estimate of the receiver tuning error in a few time records. To save computation time, in a preferred embodiment, the confidence test is only run after the cost function has been updated 100 times. The test is then run after each additional 50 cost function updates up to the maximum number of records allowed (step 52). Other numbers of records and updates are within the scope of this invention.

It is continuously determined whether the next speech record is finished and once finished, the signal processing begins on the next speech record along with the subsequent determination of the presence of a voiced sound with good signal to noise and interference ratio therein.

When 50 additional updates are obtained, a determination is made as to whether the results, i.e., the updated cost, are statistically significant (step 54).

If the results are significant, then the radio can be tuned (step 56).

If the results are not significant, i.e., there is little difference in the cost function value between the best tuning estimate and the second best tuning estimate, a determination is made whether the maximum number of records has been reached (step 58). If not, a determination is made as to whether the speech record being collected is finished (step 14) and the method proceeds to obtain an additional set of new records containing voiced sound with good signal to noise and interference ratios. If the maximum number of records has been reached, then it is assumed that the transmission cannot be tuned in accordance with the invention and the process is stopped (step 60).

The invention, in any of the embodiments described above, is a significant improvement over prior art automatic tuning methods wherein a fixed number of tests are considered. Considering a fixed number of tests results in the receiver being often tuned to an incorrect frequency. Increasing the number of tests could reduce the number of errors, but at the cost of greatly increased times for most estimates. Moreover, as discussed above, the system, i.e., the first, second and third processing units 70, 74, 78, the first and second conversion units 72, 76 and the analysis unit 80, can be either implemented with at least one of external hardware and/or a computer (see FIG. 11A), each of which would be coupled to the receiver, or implemented internally in new receivers (see FIG. 11B).

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

The invention claimed is:

1. A method for tuning a Single Sideband receiver to receive signals at a desired frequency, comprising:
- obtaining an audio signal at the receiver, the audio signal being received at a first frequency;
- processing the obtained signal in a time domain via a first processing unit associated with the receiver;
- converting the obtained signal to a frequency domain via a first conversion unit associated with the receiver;
- processing the signal converted into the frequency domain to further modify the signal via a second processing unit associated with the receiver and thereby form a modified signal;
- converting the modified signal from the frequency domain to a correlation domain via a second conversion unit associated with the receiver;
- processing the converted, modified signal in the correlation domain via a third processing unit associated with the receiver to thereby obtain a processed signal;
- analyzing the processed signal from the correlation domain via an analysis unit associated with the receiver to determine a receiver tuning error; and
- retuning the receiver to obtain audio signals at a second frequency derived from the first frequency adjusted based on the determined receiver tuning error.

2. The method of claim 1, further comprising filtering the signal via a filtering unit, prior to processing in the time and frequency domains.

3. The method of claim 1, wherein the step of processing the signal in the time or frequency domain via the first or second processing unit comprises spectral flattening the signal.

4. The method of claim 3, wherein the step of spectral flattening the signal in the time domain comprises center clipping the signal.

5. The method of claim 4, wherein the signal is center clipped in the time domain by determining a level at which the signal is clipped based on a root mean squared (RMS) or mean absolute deviation criteria.

6. The method of claim 4, wherein the signal is center clipped in the time domain, the step of processing the signal in the time domain via the first processing unit comprising windowing the center clipped signal.

7. The method of claim 6, wherein the step of windowing the center clipped signal comprises selecting a length of a window based on an initial estimate of a pitch of the signal.

8. The method of claim 6, wherein the step of windowing the center clipped signal comprises utilizing a triangular window.

9. The method of claim 6, wherein the step of windowing the center clipped signal comprises applying a plurality of sets of start and end times to the center clipped signals to obtain a window between each start and end time, and selecting the start and end times and thus a size of the windows such that the windows overlap one another.

10. The method of claim 3, further comprising converting the signal to magnitude to remove time information.

11. The method of claim 10, further comprising center clipping a signal magnitude in the frequency domain to remove unwanted noise.

12. The method of claim 11, further comprising zero-padding the center clipped magnitude in the frequency domain to improve resolution in the correlation domain.

13. The method of claim 1, wherein the step of processing the signal in the correlation domain via the third processing unit comprises correcting for processing of the signal in the time domain via the first processing unit.

14. The method of claim 13, wherein the processing of the signal in the time domain via the first processing unit comprises windowing the signal, the correction for processing of the signal in the time domain constituting correction for undesired effects resulting from the time domain processing of the signal.

15. The method of claim 13, wherein the step of processing the signal in the correlation domain via the third processing unit further comprises determining the location of a peak magnitude of the signal in the correlation domain; converting the signal to a parabola having at least 5 points; and selecting the 5 points centered around a square of the determined location of the peak magnitude of the signal in the correlation domain.

16. The method of claim 15, wherein the step of processing the signal in the correlation domain via the third processing unit further comprises calculating a pitch and an offset frequency based on the determined location of the peak magnitude of the signal in the correlation domain.

17. The method of claim 1, wherein the step of processing the signal in the correlation domain via the third processing unit further comprises determining a location of a peak magnitude of the signal in the correlation domain and calculating a pitch and offset frequency based on the determined location of the peak magnitude of the signal in the correlation domain.

18. The method of claim 17, wherein the step of analyzing the processed signal from the correlation domain to determine a pitch and offset frequency comprises determining whether the peak magnitude is above a threshold indicative of a voiced sound and if not, disregarding the processed signal.

19. The method of claim 18, wherein the step of analyzing the processed signal from the correlation domain to determine the receiver tuning error further comprises forming a cost function from the processed signal from the correlation domain when the peak magnitude is above the threshold, the cost function being formed such that voiced sounds that are far from estimated receiver tuning error contribute a larger error.

20. The method of claim 19, wherein the cost function is a least squares estimate of the receiver tuning error.

21. The method of claim 19, wherein the cost function is a least squares estimate of the receiver tuning error weighted by a ratio of correlation peak power to total processed power.

22. The method of claim 19, wherein the step of analyzing the processed signal from the correlation domain to determine the receiver tuning error further comprises determining whether a statistically significant difference is present between a first estimate and a second estimate of the receiver tuning error derived from the cost function and if so, considering the first estimate as the receiver tuning error.

23. The method of claim 22, wherein when a determination is made that the statistically significant difference is not present between the first estimate and the second estimate of the receiver tuning error, the method further comprising processing additional received voiced signals.

24. The method of claim 22, wherein the step of analyzing the processed signal from the correlation domain to determine the receiver tuning error further comprises determining whether a set number of received voiced signals have been processed and the step of determining whether the statistically significant difference is present between the first estimate and the second estimate of the receiver tuning error occurs only after the set number of received voiced signals have been processed.

25. The method of claim 1, wherein the obtaining of the audio signals and the processing of the signals is performed simultaneously such that as one audio signal is being processed, another audio signal is being obtained.

26. The method of claim 6, wherein the step of processing the signal in the time domain via the first processing unit further comprises zero-padding the windowed, center clipped signal.

27. A system for tuning a Single Sideband receiver to receive signals at a desired frequency, the receiver obtaining an audio signal at a first frequency, the system comprising:

a first processing unit that processes the obtained audio signal in a time domain;

a first conversion unit that converts the obtained audio signal to a frequency domain;

a second processing unit that processes the signal converted into the frequency domain to further modify the signal and thereby form a modified signal;

a second conversion unit that converts the modified signal from the frequency domain to a correlation domain;

a third processing unit that processes the converted, modified signal in the correlation domain to thereby obtain a processed signal; and an analysis unit that analyzes the processed signal from the correlation domain to determine a receiver tuning error;

whereby the receiver is retuned to obtain audio signals at a second frequency derived from the first frequency adjusted based on the determined receiver tuning error.

28. The system of claim 27, wherein the first processing unit, the first conversion unit, the second processing unit, the second conversion unit, the third processing unit and the analysis unit are implemented internally in the receiver.

29. The system of claim 27, wherein the first processing unit, the first conversion unit, the second processing unit, the second conversion unit, the third processing unit and the analysis unit are implemented with at least one of an external hardware component and a computer, each of which is coupled to the receiver.

* * * * *